United States Patent [19]
Bell et al.

[11] Patent Number: 5,212,626
[45] Date of Patent: May 18, 1993

[54] ELECTRONIC PACKAGING AND COOLING SYSTEM USING SUPERCONDUCTORS FOR POWER DISTRIBUTION

[75] Inventors: David F. Bell, Woodstock, N.Y.; Bruno R. Pagnani, Raleigh, N.C.; James R. Warnot, Jr., Rhinebeck, N.Y.

[73] Assignee: International Business Machines Corporation, Armonk, N.Y.

[21] Appl. No.: 612,288

[22] Filed: Nov. 9, 1990

[51] Int. Cl.$^5$ .............................................. H05K 7/20
[52] U.S. Cl. ................................... 361/385; 62/259.2; 174/15.4; 361/382; 505/1; 505/700; 257/716
[58] Field of Search ................ 62/64, 259.2; 174/15.4; 505/700, 701, 703; 357/82, 83; 165/104.33; 361/382, 385, 400, 403-405, 408, 414

[56] References Cited

U.S. PATENT DOCUMENTS

| | | | |
|---|---|---|---|
| 4,138,692 | 2/1979 | Meeker et al. | 357/82 |
| 4,805,420 | 2/1989 | Porter | 357/83 |
| 4,809,135 | 2/1989 | Yerman | 361/404 |
| 4,954,480 | 9/1990 | Imanaka | 505/701 |
| 4,960,751 | 10/1990 | Yamazaki | 505/703 |
| 4,980,754 | 12/1990 | Kotani | 357/83 |

FOREIGN PATENT DOCUMENTS 0292125 4/1988 European Pat. Off. .
0367630 11/1989 European Pat. Off. .
3812662 4/1988 Fed. Rep. of Germany .

OTHER PUBLICATIONS

"A New Set of Printed-Circuit Technologies for the IBM 3081 Processor Unit"; D. P. Seraphim, IBM J. Res. Develop, vol. 26, No. 1; Jan. 1982, pp. 37-44.
"Epitaxial Films of . . . "; G. Koren et al., Appl. Phys. Lett., 54(11); Mar. 13, 1989; pp. 1054-1056.
"Role of Atomic Oxygen in . . . "; G. Koren et al., Appl. Phys. Lett., 54(19), May 8, 1989; pp. 1920-1922.
"Epitaxial Growth of . . . "; S. G. Lee et al., Appl. Phys. Lett., 55(12); Sep. 18, 1989; pp. 1261-1263.
IBM Technical Disclosure Bulletin, vol. 20, No. 9, Feb. 1978, pp. 3452-3453, "Semiconductor Package with Improved Cooling".
IBM Technical Disclosure Bulletin, vol. 18, No. 4, Sep. 1975, pp. 1226-1229 by V. L. Rideout.

*Primary Examiner*—Gerald P. Tolin
*Attorney, Agent, or Firm*—Mark S. Walker; William A. Kinnaman, Jr.

[57] ABSTRACT

A board containing plural superconducting power planes, one for each required potential level, is used to distribute power to one or more semiconductor logic chips which, together with the board, are immersed in liquid nitrogen. Each chip is coupled thermally to a heat exchanger and is coupled electrically to the board through leads that minimize heat transfer from the chip to the board.

8 Claims, 2 Drawing Sheets

ELECTRONIC PACKAGING AND COOLING SYSTEM USING SUPERCONDUCTORS FOR POWER DISTRIBUTION

BACKGROUND OF THE INVENTION

1. Field of the Invention

The present invention generally relates to packaging of electronic components and, more particularly, to a packaging system for electronic circuit boards incorporating superconducting power planes, which system prevents thermal feedback from integrated circuit chips to superconducting power planes that would otherwise raise the temperature of the power planes above their critical super-conducting temperature.

2. Description of the Prior Art

Current large electronic circuit board construction consists of large power planes and external power busing which brings power onto the circuit board very close to heat generating modules such as integrated circuit chips. While individual chips consume but small amounts of power and generate only small amounts of heat, very large electronic systems use many chips densely packed on circuit boards. Collectively, these chips draw large amounts of current, leading to considerable resistive and thermal loses.

Current packaging systems for large systems contain multichip modules connected directly to an interconnection circuit board. One specific example of this type of packaging system is thermal conduction module (TCM) board manufactured by IBM and described by Donald P. Seraphim in "A New Set of Printed-Circuit Technologies for the IBM 3081 Processor Unit", *IBM J. Res. Develop.*, Vol. 26, No. 1, January 1982, pp. 37–44. Future projects will require massive structures, both within the board and in the external busing, to handle up to 10,000 amperes. These massive structures are necessary to reduce both resistive heating and voltage drop to allowable levels.

SUMMARY OF THE INVENTION

It is therefore an object of the present invention to provide an electronic packaging scheme using superconductors for power distribution to integrated circuit chips but which minimizes heat transfer from chips into the superconductors.

It is another object of the invention to provide an electronic packaging scheme for integrated circuit chips powered by superconductors on a power distribution board in which chip heat feedback to the power distribution board is substantially prevented.

In order to minimize losses and reduce the power planes to acceptable sizes, it has been proposed to use superconductors for power distribution. For this to work, the superconductors must be refrigerated to below their critical superconducting temperature. The problem, however, is that the integrated circuit chips to which the power is being distributed themselves generate a considerable amount of heat that tends to raise the temperature of the superconductors above their critical temperature.

According to the invention, a board containing plural superconducting power planes, one for each required potential level, is used to distribute power to one or more semiconductor logic chips which, together with the board, are immersed in liquid nitrogen. Each chip is coupled thermally to a heat exchanger and is coupled electrically to the board through leads that minimize heat transfer from the chip to the board.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
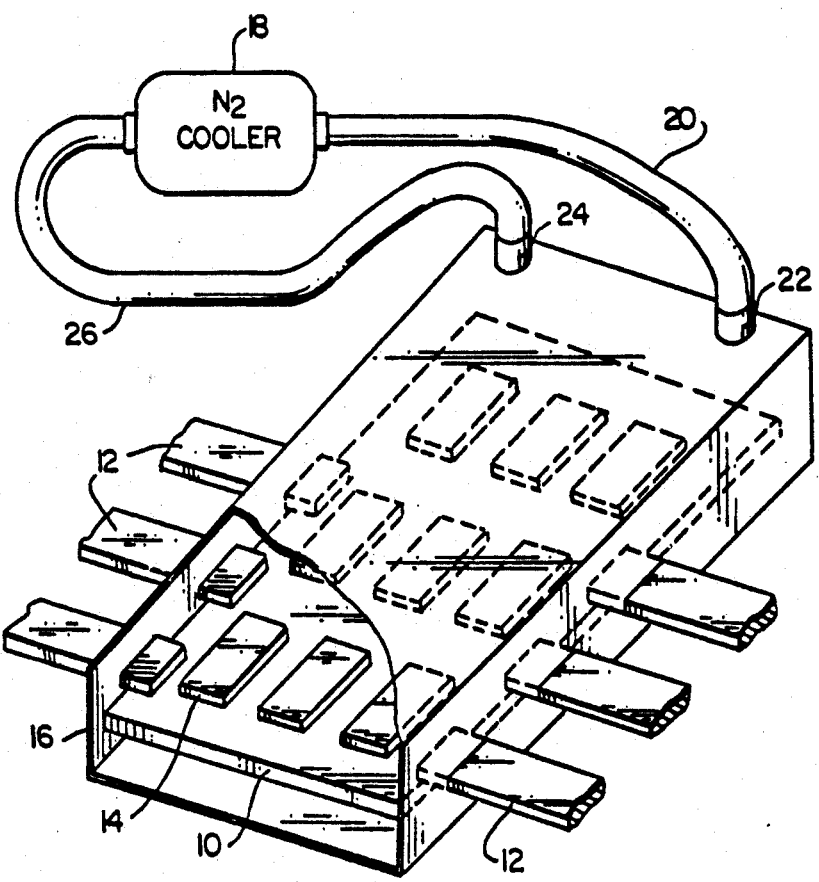
FIG. 1 is a perspective view showing an interconnection board having a plurality of chips supplied by power bus leads and cooled by liquid nitrogen.

In the drawings, like reference numerals refer to like or similar parts. Referring now to the drawings, and more particularly to FIG. 1, there is shown a perspective view that generally illustrates the structural arrangement according to the invention. More specifically, an interconnection board 10 is connected to a plurality of power bus leads 12, one for each voltage level. The interconnection board 10 comprises a plurality of planes (not shown) fabricated in a manner well known in the art. These planes include power and signal planes. In the case of the power planes, the patterned metallic layers are composed of a superconducting material, such as yttrium-barium-copper oxide ($YBa_2Cu_3O_{7-\delta}$). Formation of thin films of this particular superconducting material is discussed, for example, by G. Koren, A. Gupta, E. A. Glass, A. Segmüller, and R. B. Laibowitz in "Epitaxial films of $YBa_2Cu_3O_{7-\delta}$ on $NdGaO_3$, $LaGaO_3$, and $SrTiO_3$ substrates deposited by laser ablation", *Appl. Phys. Lett.*, 54(11), Mar. 13, 1989, pp. 1054–1056, by G. Koren, A. Gupta and R. J. Baseman in "Role of atomic oxygen in the low-temperature growth of $YBa_2Cu_3O_{7-\delta}$ thin films by laser ablation deposition", *Appl. Phys. Lett.*, 54(19), May 8, 1989, pp. 1920–1922 and by S. G. Lee, G. Koren, A. Gupta, A. Segmüller, and C. C. Chi in "Epitaxial growth of $YBa_2Cu_3O_{7-\delta}$ thin films on $LiNbO_3$ substrates", *Appl. Phys. Lett.*, 55(12), Sep. 18, 1989, pp. 1261–1263.

There are as many power planes in the interconnection board 10 as there are voltage levels required for the logic chips 14 mounted on the interconnection board. The critical superconducting temperature $T_c$ of the superconducting material in the power planes of the interconnection board 10 is typically above 77° Kelvin (K). In order to maintain this temperature, a cooling shroud 16 covers the chips 14 and the interconnection board 10.

The cooling shroud 16 is shown in FIG. 1 as partially broken away to reveal the interconnection board 10 and some of the chips 14. For the sake of simplicity, the cooling shroud 16 is illustrated as a single wall structure, but it will be understood by those skilled in the art that the shroud would be typically vacuum insulated, as is conventional with liquid nitrogen containers. Furthermore, it will be observed that the power leads 12 pass through the sides of the shroud 16 and attach to the interconnection board 10. The points where the power leads pass through the shroud are suitably sealed to prevent the leakage of coolant.

A nitrogen ($N_2$) cooler 18 supplies liquid nitrogen at a temperature of 70° K. to the shroud 16 via a conduit 20 connected to an inlet 22 on the shroud 16 to maintain the superconducting power planes at the critical superconducting temperature. Nitrogen is returned to the cooler 18 via outlet 24 on the shroud 16 and a conduit 26.

Since the entire interconnection board 10 and the chips 14 are within the shroud 16 and immersed in liquid nitrogen, thus maintaining the power planes below $T_c$, there is no ohmic ($I^2R$) heating because the power planes have zero resistance. It will be understood from this generalized depiction that the transition of the power bus leads 12 through the shroud 16 represents a thermal transition from below the critical temperature $T_c$ on the cooled board to the ambient temperature outside the shroud 16. The capacity of the cooler 18 is, however, sufficient to compensate for any heat leaks through the power leads 12.

The key to successful operation of the system is maintaining the power planes of the interconnection board 10 below the critical temperature $T_c$. In order to do this, it is necessary to thermally isolate the integrated circuit chips 14 from the power planes. This is accomplished according to the invention by eliminating the thermal feedback from the integrated circuit chips 14 to the power planes of the interconnection board 10. Four preferred embodiments are now described to illustrate how this is done.

Figure 2:
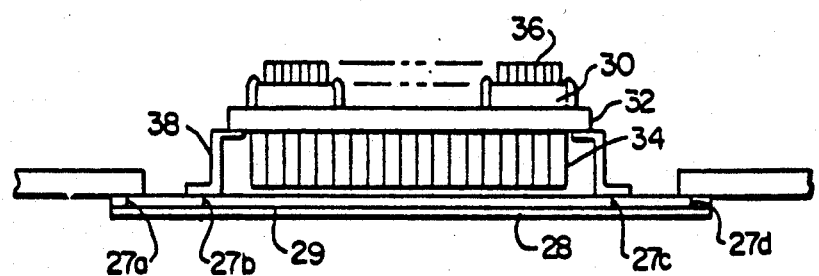
FIG. 2 is a side view of a multi-chip module attached to a large circuit board showing a first embodiment of the invention.

With reference now to FIG. 2, there is shown a large interconnection board 28 which is understood to comprise one or more superconducting power planes. Power plane 29 is shown by way of example with plated through holes 27a, 27b, 27c, 27d providing electrical connections to the surface. A more complete description of existing techniques of power plane construction is provided in the Seraphim article cited above. The chips 30 are flip-chip attached to a substrate 32 and thermally bonded to the substrate. A heat exchanger 34 is attached to the bottom of the substrate 32. A similar heat exchanger 36 may also be attached to the chips 30. Both of the heat exchangers 34 and 36 may be, for example, silicon fine groove heat exchangers. The entire substrate 32 is then attached to the board 28 through flat pack type leads 38. As is well known, flat pack type leads offer a poor thermal path. While only one substrate is shown, it will be understood that a plurality of substrates, each with a plurality of chips, may be attached to a single board.

Since the entire structure is immersed in liquid nitrogen, the heat from the integrated circuit chips will then be removed in the heat exchanger, as well as directly from the chip, before it can reach the board 28. The small amount of heat which travels down the module leads 38 will be removed by the convection environment of the entire system in the liquid nitrogen bath.

Figure 3:
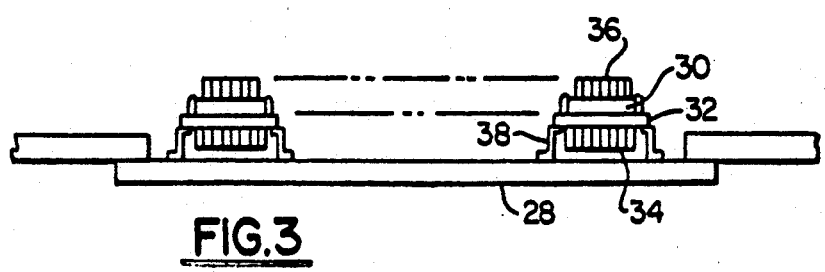
FIG. 3 is a side view of a plurality of single chip modules attached to a large circuit board showing a second embodiment of the invention.

If a very high level of chip integration is achievable, multiple chip substrates may not be necessary. This entire concept may then be implemented using single chip modules as shown in FIG. 3.

Figure 4:
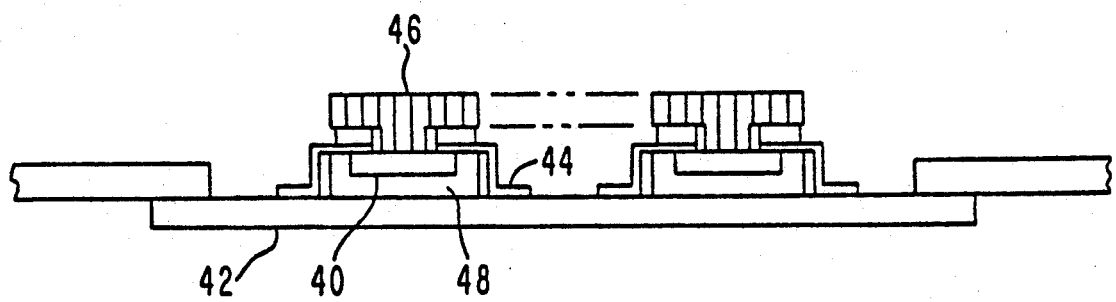
FIG. 4 is a side view of a plurality of single chip modules encapsulated in epoxy and attached to a large circuit board showing a third embodiment of the invention.

In FIG. 4, the chips 40 are attached to the board 42 via leads 44 which are wire bonded to the chip. A heat exchanger 46 is attached directly to the top of each chip 40. The chip is then encapsulated in a polymer such as epoxy 48, providing environmental and thermal insulation. The thermal resistance of the leads 44 is much greater than that of the heat exchanger, so only a small percentage of the chip heat will travel down them. This small amount of heat will be removed by the convection environment of the liquid nitrogen bath before it reaches the board.

Figure 5:
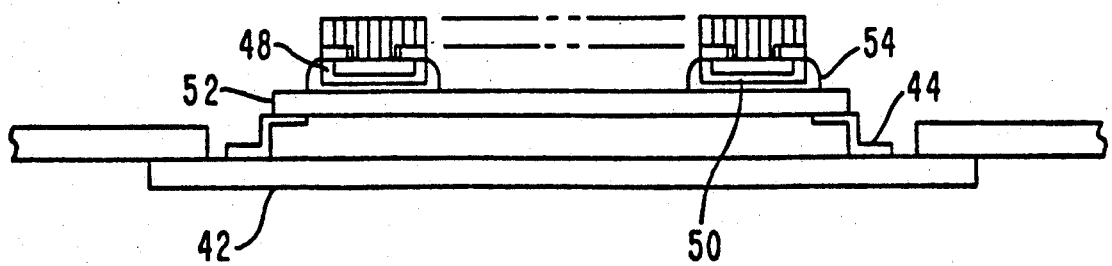
FIG. 5 is a side view of a multi-chip module wherein each of the chips are encapsulated in epoxy and attached to a large circuit board showing a fourth embodiment of the invention.

If a multi-chip module similar to that shown in FIG. 2 is required, the chips 50 can be mounted on a single large substrate 52, as shown in FIG. 5, or a plurality of large substrates. If space is at a premium, a J-lead configuration 54 can be used instead of a conventional flat-pack type lead.

From the foregoing, it will be appreciated that there are various combinations of structures which will produce the desired objective of eliminating thermal feedback from the chips to the interconnection board. The entire structure is immersed in a liquid nitrogen bath, providing the temperatures necessary for superconducting operation. The refrigeration/pump unit continuously circulates and cools the liquid nitrogen, preventing boil-off. The liquid nitrogen also acts as the coolant for the chips, which are the only heat source since resistive heating in the power distribution planes is eliminated.

In order to make this system viable, heat feedback from the chips to the board power planes is eliminated, since this would cause the temperature of the power planes to rise above $T_c$, the critical superconductivity temperature. At the critical current densities projected, a significant reduction in size and weight can be realized by the invention. For example, nine 10-oz. power planes can be reduced to four 1-oz. planes. The input from the power supplies is connected to the large board at both sides (or one side), eliminating the need for laminar power bus structures. This provides the possibility of higher module packaging densities on the board.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. An electronic packaging system comprising:
   a sealed enclosure containing an internal cavity;
   cooling means for maintaining a temperature within said internal cavity below a critical superconductive temperature, said cooling means connected to said sealed enclosure;
   an interconnection board having at least one power plane, said power plane comprising a material that is superconductive below said critical superconductive temperature, said interconnection board disposed within said internal cavity of said sealed enclosure;
   at least one power supply bus connected to said at least one power plane, said at least one power supply bus extending through a sealed opening in said sealed enclosure and supplying an electrical potential to said at least one power plane;

at least one semiconductor logic chip;

mounting means mounting said logic chip in said cavity in a position offset from said interconnection board, said mounting means electrically connecting said power plane of said interconnection board to said logic chip; and thermal isolation means connected between said chip and said interconnection board for preventing heat transfer from said semiconductor logic chip to said interconnection board.

2. The packaging system of claim 1 wherein said thermal isolation means comprises heat exchange means for dissipating heat generated by said semiconductor logic chip, said heat exchange means being thermally bonded to said logic chip so that it is disposed between said logic chip and said interconnection board.

3. The system of claim 1 in which said interconnection board contains a plurality of parallel power planes, each comprising a material that is superconductive below said superconductive temperature, said system further comprising a plurality of power busses, each of said power busses supplying a different potential to each of said planes.

4. The system of claim 1 wherein said mounting means comprises:

a substrate to which said chip is thermally bonded;

flip-chip wire bonds electrically connecting said semiconductor logic chip to said substrate; and flat pack leads electrically connecting said substrate to said interconnection board.

5. The system of claim 1 wherein said thermal isolation means comprises a polymer encapsulating said semiconductor logic chip.

6. The system of claim 5 wherein said polymer is an epoxy.

7. The system recited in claim 4 wherein there are a plurality of additional chips, each of said chips being thermally bonded to an additional substrate.

8. The system recited in claim 4 wherein there are a plurality of additional chips, each of said chips being thermally bonded to said substrate.

* * * * *